US007510441B2

(12) United States Patent
Zhang et al.

(10) Patent No.: US 7,510,441 B2
(45) Date of Patent: Mar. 31, 2009

(54) ELECTRICAL CONNECTOR HAVING IMPROVED BASED ELEMENT

(75) Inventors: Hong-Bo Zhang, Kunshan (CN); Zheng-Hua Xu, Kunshan (CN); Li-Chun Wu, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/074,361

(22) Filed: Mar. 3, 2008

(65) Prior Publication Data

US 2008/0214060 A1 Sep. 4, 2008

(30) Foreign Application Priority Data

Mar. 2, 2007 (CN) ........................ 2007 1 0020178

(51) Int. Cl.
*H01R 13/66* (2006.01)

(52) U.S. Cl. ................................................. 439/620.18

(58) Field of Classification Search ............ 439/620.23, 439/620.17, 620.18
See application file for complete search history.

(56) References Cited

U.S. PATENT DOCUMENTS 6,641,440 B1 * 11/2003 Hyland et al. .......... 439/620.17
6,655,988 B1 * 12/2003 Simmons et al. ......... 439/541.5
7,134,915 B1 * 11/2006 Tsai ...................... 439/620.01
7,153,158 B1 * 12/2006 Lee ......................... 439/541.5

* cited by examiner

*Primary Examiner*—Neil Abrams
*Assistant Examiner*—Phuong Nguyen
(74) *Attorney, Agent, or Firm*—Wei Te Chung

(57) ABSTRACT

An electrical connector (200) for engaging with a mating plug includes a terminal module (400) having an insulative insert (401) and rows of terminals (4) mounted to the insulative insert, a base element (300) and a daughter board (600) attached to a side face of the base element. The base element has a pair of opposite contacting portions (301) disposed on a front section thereof and a cutout (10) defined between the pair of contacting portions. The cutout is configured to cooperate with the terminal module with an inner edge (31) engaging to a corresponding passage (81) defined on a rear face of the insulative insert.

11 Claims, 7 Drawing Sheets

100

ELECTRICAL CONNECTOR HAVING IMPROVED BASED ELEMENT

BACKGROUND OF THE INVENTION

1. Field of the Invention

The present invention relates to an electrical connector and particularly to electrical connector comprising an improved base element for engaging with a terminal module.

2. Description of the Prior Art

A U.S. Pat. No. 7,134,915 issued on Dec. 14, 2006 discloses an electrical connector. The electrical connector engaging with a mating plug comprises a left and a right base part mutually connecting and symmetrically arranged and a plurality of terminals embedded therein and extended outwardly to be connected circuit board. The electrical connector has two connecting pin sets mutually and conversely mounted to the left and right base part. The left and right base parts respectively has bending portion extending from a bottom of said left base part and a top of right base part, thus forming two grooves for coupling with the connecting pin sets.

However, the electrical connector defines two grooves at the front sides of the left and the right base parts to assemble the two connecting pin sets, that would complicate the manufacture of the electrical connector and render the structure unstable.

Hence, an electrical connector is needed to solve the above problem.

BRIEF SUMMARY OF THE INVENTION

One object of the present invention is to provide an electrical connector having an improved base element adapted for mating with a terminal module easily and firmly.

The present invention provides an electrical connector for engaging with a mating plug (not shown) comprising a terminal module having an insulative insert and rows of terminals mounted to the insulative insert, a base element and a daughter board attached to a side face of the base element. The base element comprises a pair of opposite contacting portions disposed on a front section thereof and a cutout defined between the pair of contacting portions. The cutout is configured to cooperate with the terminal module with an inner edge engaging to a corresponding passage defined on a rear face of the insulative insert.

Thus, the terminal module is easy to be mounted into the cutout and firmly fixed in the cutout by the interference between the passage of the insulative insert and the inner edge of the cutout of the base element.

Other objects, advantages and novel features of the invention will become more apparent from the following detailed description of the present embodiments when taken in conjunction with the accompanying drawings.

DETAILED DESCRIPTION OF THE INVENTION

Figure 1:
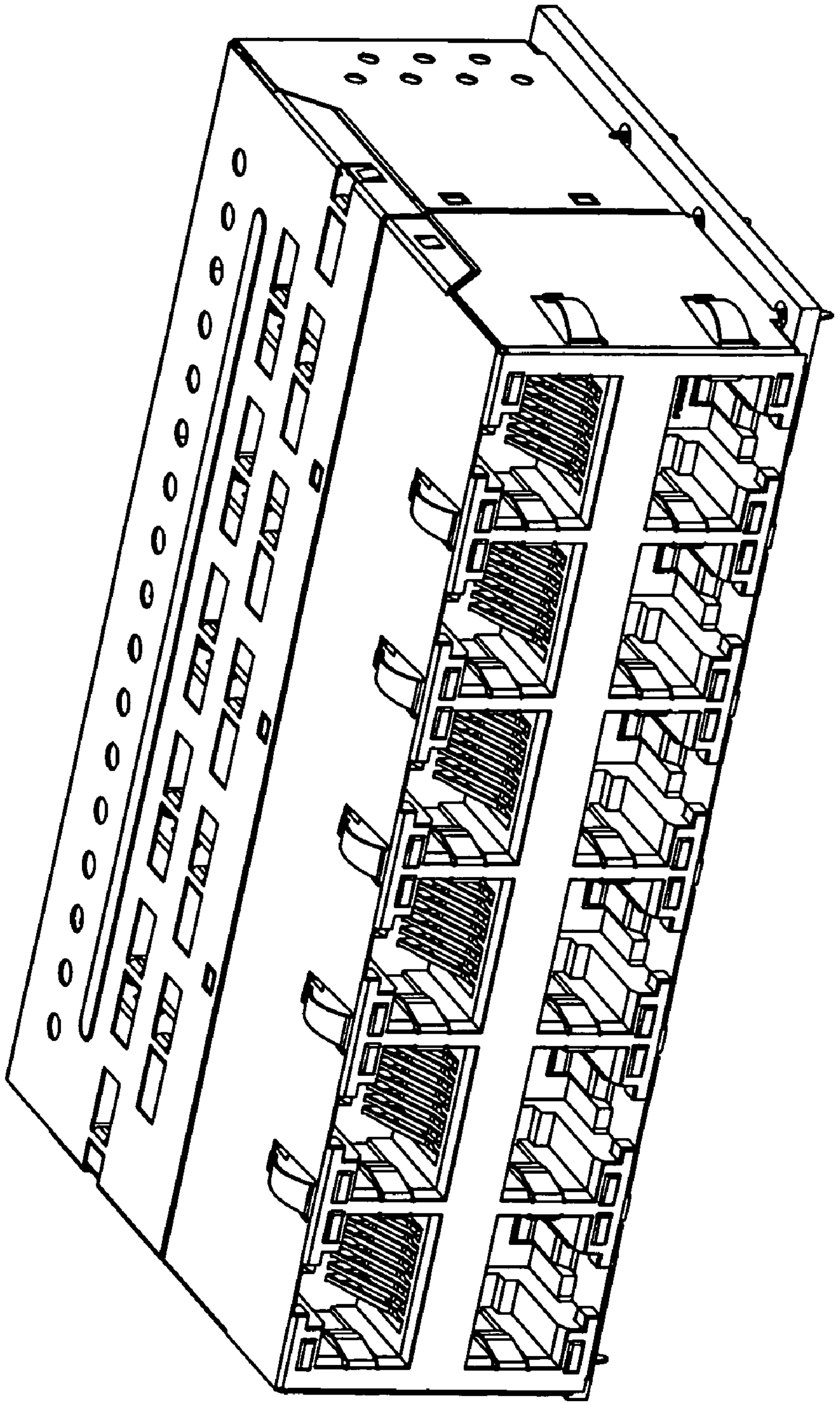
FIG. 1 is an assembled view of an electrical connector mounted a mother board.
Figure 2:
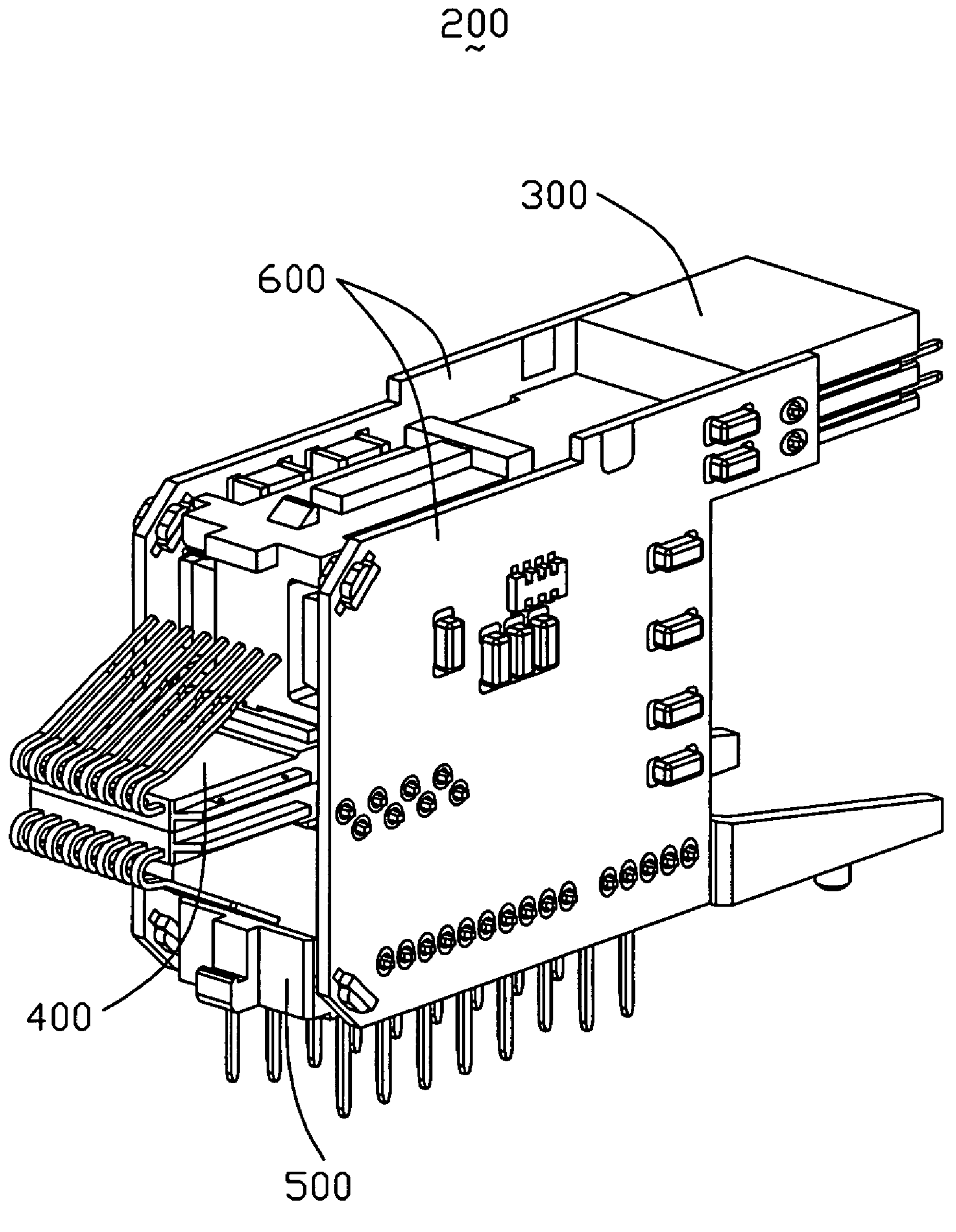
FIG. 2 is an assembled view of the electrical connector.
Figure 3:
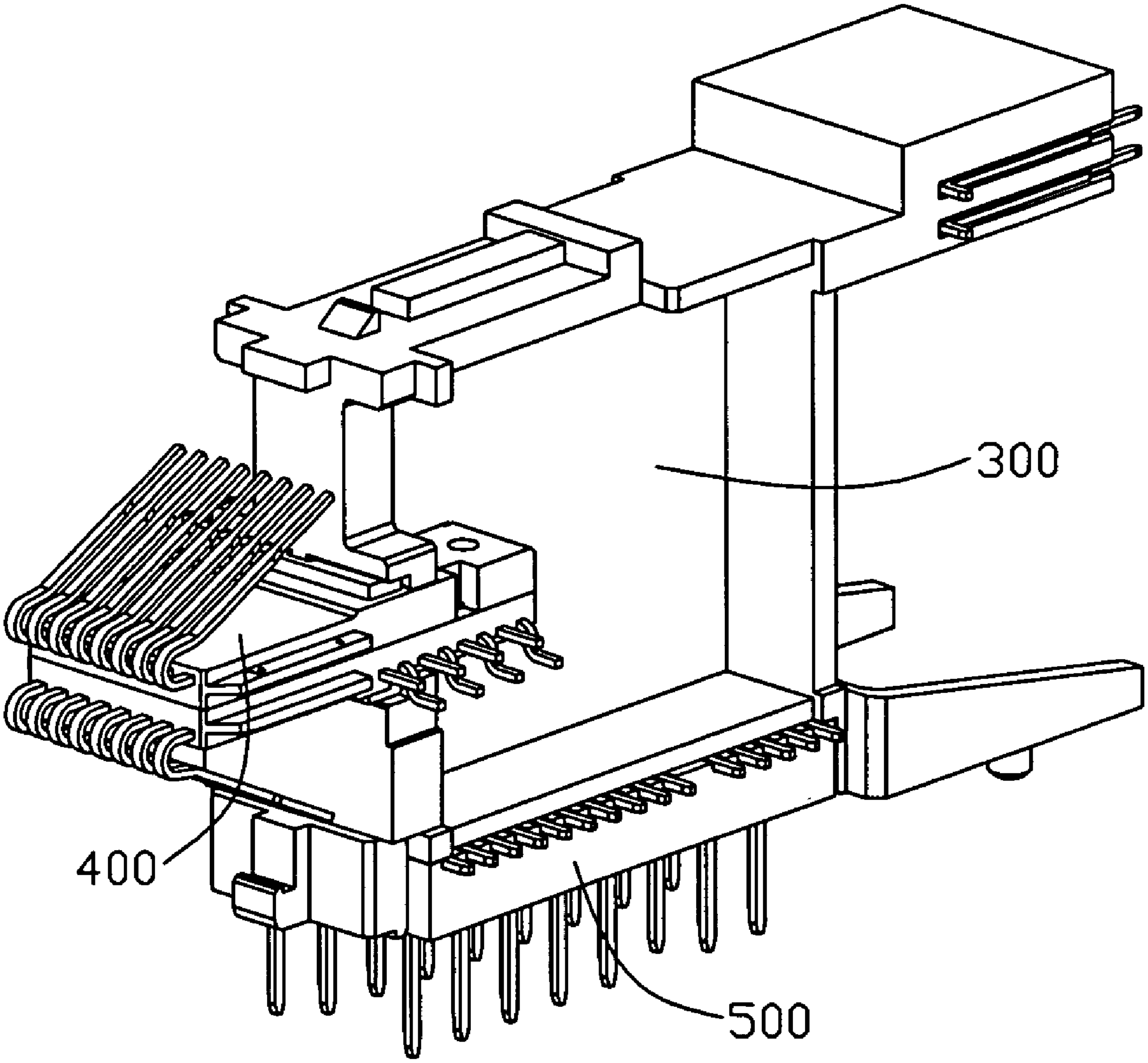
FIG. 3 is a partially assembled view of the electrical connector as shown in FIG. 2.

Reference will now be made to the drawing figures to describe the present invention in detail. Referring to FIGS. 1-3, an electrical connector 100 for engaging with a mating plug (not shown) comprises a base element 300, a terminal module 400 mounted to the base element 300, a pair of daughter boards 600 attached to opposite side faces of the base element 300 and a spacer 500 mounted below the base element 300. The terminal module 400 includes an insulative insert 401 and two groups of terminals 4 mounted to the insulative insert 401.

As shown in FIGS. 4-7, the base element 300 has a pair of opposite contacting portions 301 respectively disposed on a front section 30 thereof and a cutout 10 defined between the pair of contacting portions 301. The front section 30 has a top wall 1, a bottom wall 2 and a rear wall 3. The cutout 10 is configured to cooperate with the terminal module 400 with an inner edge 31 disposed on the rear wall 3 for engaging to a corresponding passage 81 defined on a rear face of the insulative insert 401. The cutout 10 is formed between the top wall 1, the bottom wall 2 and the rear wall 3. The top contacting portion 301 includes a pair of first blocks 11 perpendicularly extending from the top wall 1, a first rid 13 extending forwardly from the top wall 1 and a pair of first recesses 130 respectively defined between lateral faces of the first rid 13 and the first block 11. The first rid 13 includes a pair of first posts 131 disposed on opposite side faces thereof and extending into the first recesses 130. The bottom contacting portion 301 has a configuration and structure similar to the top contacting portion 301. Detailed description is not illustrated here.

Figure 5:
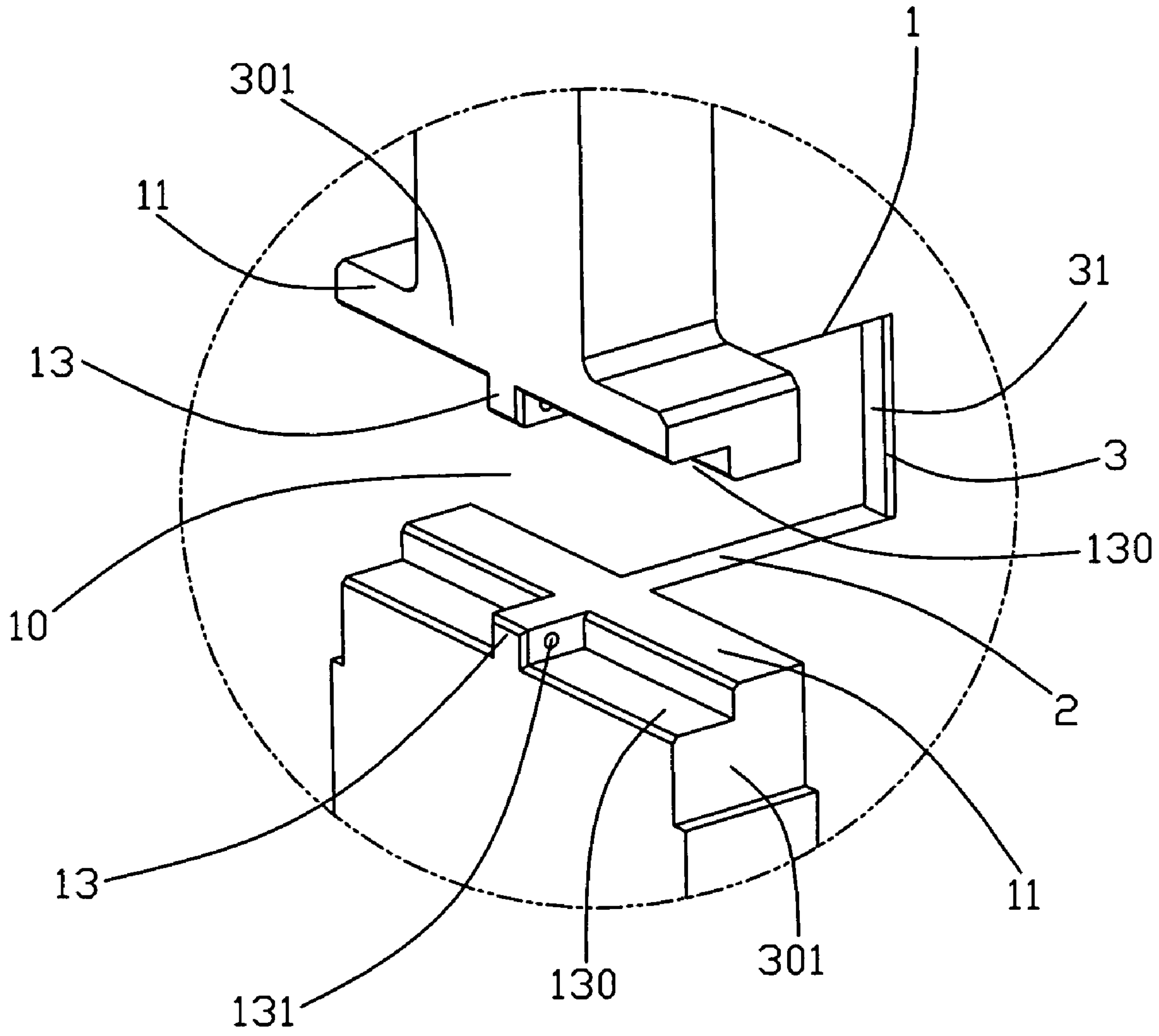
FIG. 5 is a magnifying view of a contacting, as especially labeled in FIG. 4.
Figure 6:
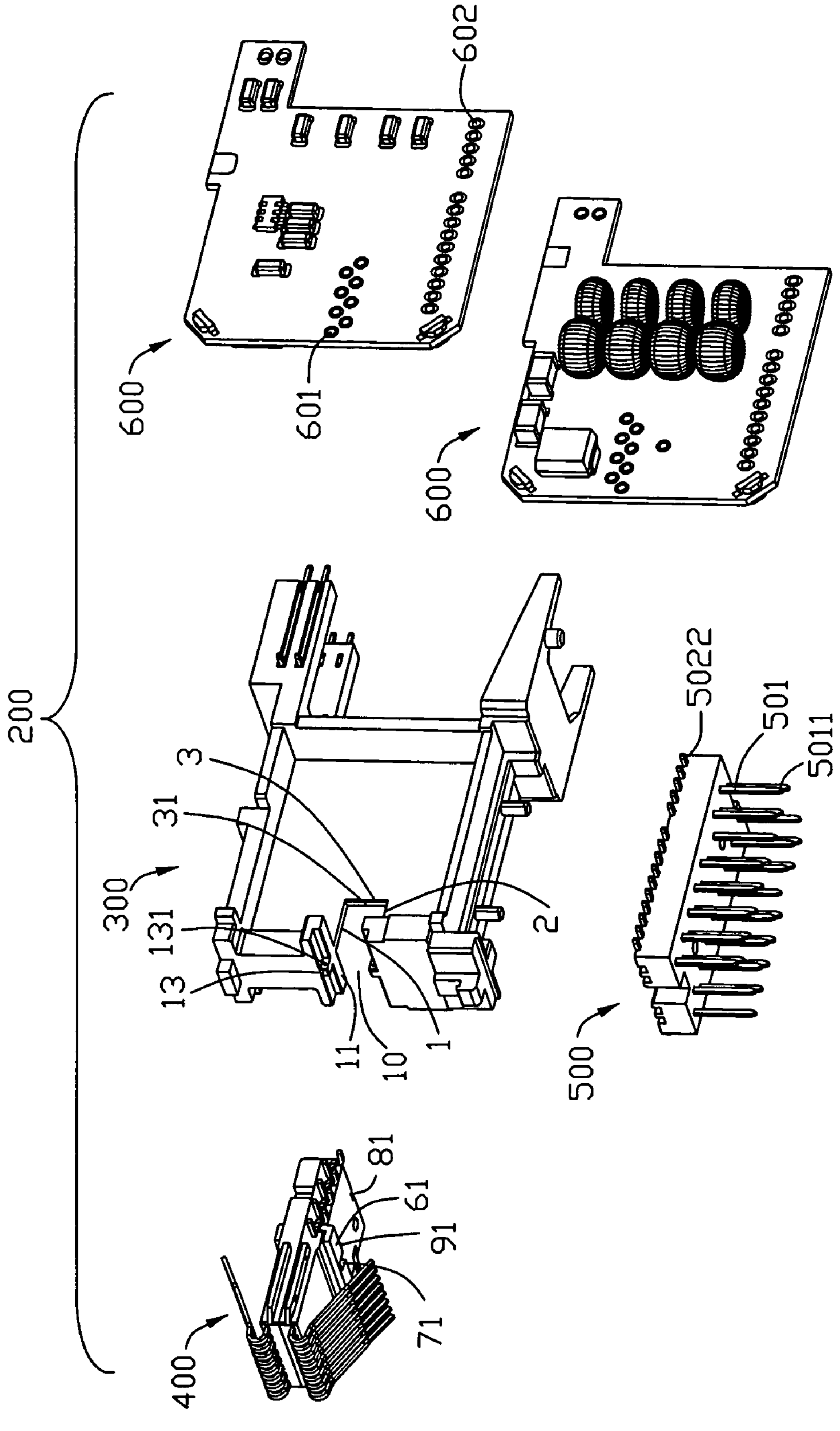
FIG. 6 is an exploded view of the electrical connector as shown in FIG. 4, taken from another aspect.
Figure 7:
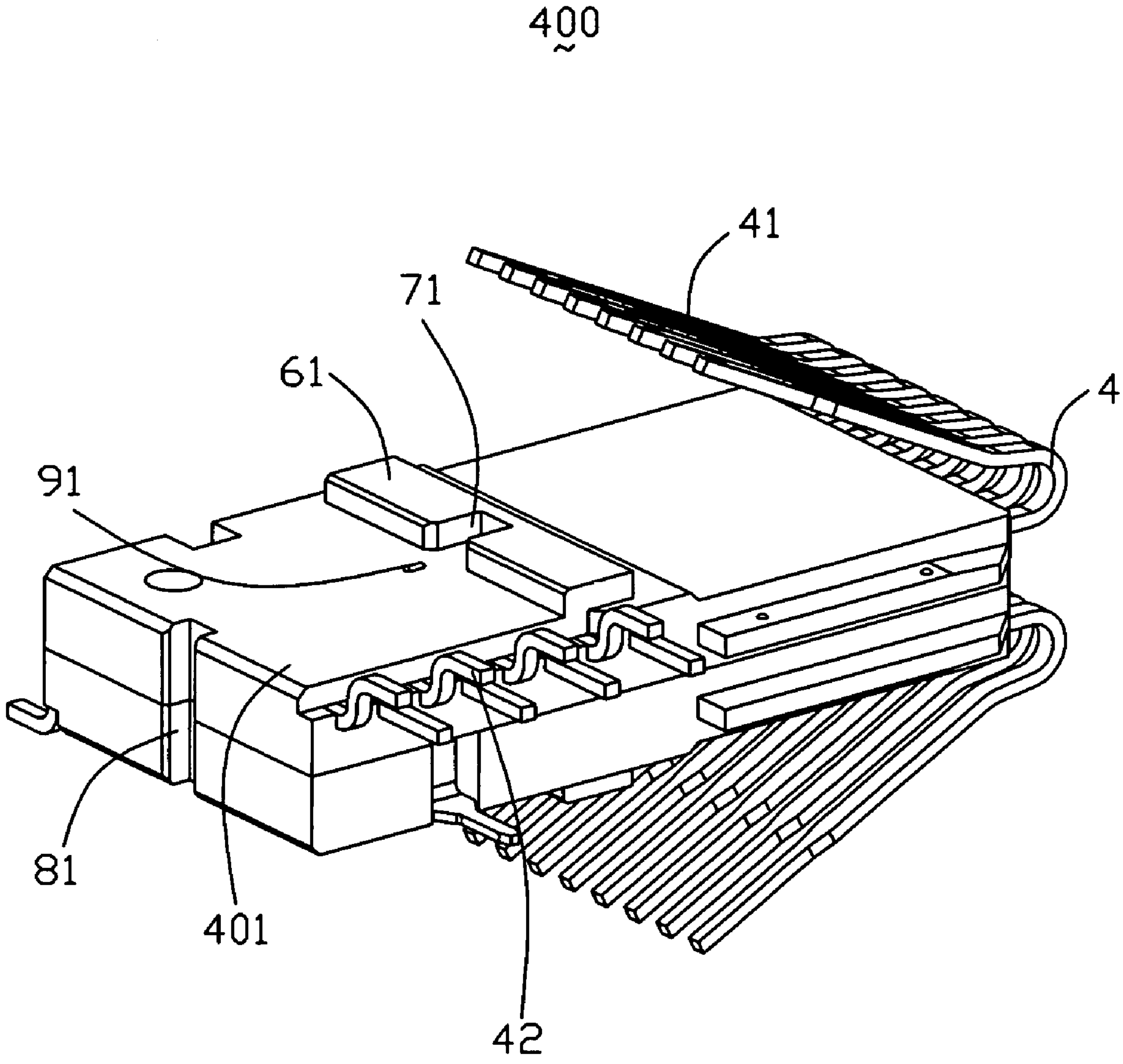
FIG. 7 is an assemble view of a terminal module as shown in FIG. 6.

Referring to FIGS. 5, 7 and 8, the top row of the terminals 4 respectively has a contacting end 41 received in the cutout 10 of the base element 300 and a tail portion 42 extending outwardly from a side portion of the insulative insert 401. The tail portions 42 extend throughout a plurality of first holes 601 disposed on the daughter board 600, thereby forming a conductive trace between the daughter board 600 and the terminal module 400. A lower row of terminals 4 extend throughout the opposite first holes 601 of the daughter board 600. The insulative insert 401 comprises a pair of opposite surfaces respectively having a pair of second blocks 61 disposed thereon, a second recess 71 defined between the pair of second blocks 61 and a second post 91 disposed on the top surface for positioning the first rid 13 to the second recess 71.

Figure 4:
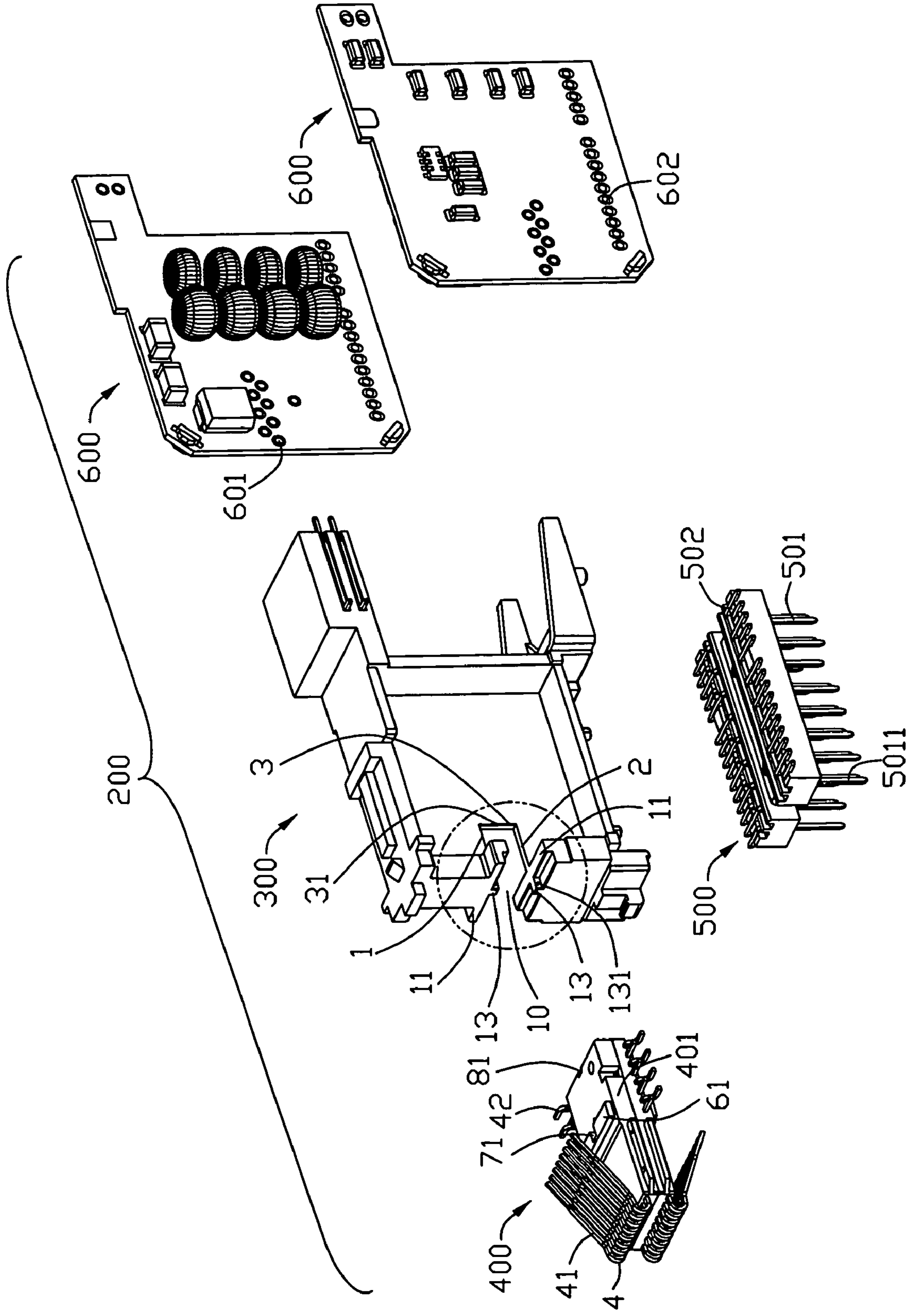
FIG. 4 is an exploded view of the electrical connector as shown in FIG. 2.

Referring to FIGS. 4 and 7, the spacer 500 is mounted to the bottom portion of the base element 300. The spacer 500 has two rows of contacts 501 assembled thereto, each row of the contacts 501 having soldering portions 5011 electrically connecting to a mother board and bending portions 5022 electrically connected to the conductive region of corresponding daughter board 600.

Referring to FIGS. 1-4, In assembling, firstly, the base element 300 is mounted to the spacer 500. Secondly, the terminal module 400 is assembled into the cutout 10. The second block 61 and the second recess 71 respectively engaging with the first recess 130 and the first rid 13 of the top contacting portions 301 firmly. The first posts 131 firmly interfere with the inner surfaces of second blocks 61. Finally, the pair of daughter boards 600 are mounted to the opposite sides of the base element 300. The tail portions 42 of the terminals 4 extend throughout the first holes 601 of the daughter boards 600. The bending portions 5022 of the contacts 501 extend throughout a plurality of second holes 602 of the daughter board 600 for electrically connected the terminals 4 to the a mother board (not shown).

It is to be understood, however, that even though numerous, characteristics and advantages of the present invention have been set fourth in the foregoing description, together with details of the structure and function of the invention, the disclosed is illustrative only, and changes may be made in detail, especially in matters of number, shape, size, and arrangement of parts within the principles of the invention to the full extent indicated by the broad general meaning of the terms in which the appended claims are expressed.

What is claimed is:

1. An electrical connector for engaging with a mating plug, comprising:

a base element, a terminal module mounted to the base element, a pair of daughter boards attached to opposite side faces of the base element and a spacer mounted below the base element;

a terminal module comprising an insulative insert and two rows of terminals mounted to the insulative insert;

the base element comprising a pair of opposite contacting portions disposed on a front section thereof and a cutout is formed between the top wall, the bottom wall and the rear wall of the front section, said cutout defined between the pair of contacting portions, said cutout is configured to cooperate with the terminal module with an inner edge engaging to a corresponding passage defined on a rear face of the insulative insert;

a top row of the terminals respectively has a contacting end received in said cutout of said base element and a tail portion extending outwardly from a side portion of said insulative insert; a top contacting portion includes a pair of first blocks perpendicularly extending from the top wall; and a lower row of terminals extend throughout an opposite first holes of the daughter board;

the tail portions extend throughout a plurality of first holes disposed on the daughter board, thereby forming a conductive trace between the daughter board and the terminal module; the daughter board attached to a side face of the base element.

2. The electrical connector as claimed in claim 1, wherein said base member and said terminals are interconnected as a cross in an elevational view.

3. The electrical connector as claimed in claim 1, wherein each terminal comprises a contacting end engaging with the mating plug.

4. The electrical connector as claimed in claim 1, further comprising a spacer mounted below the base element and two rows of contacts assembled thereto, each contact has a soldering portion and a bending portion electrically connected to the daughter board.

5. The electrical connector as claimed in claim 1, wherein said contacting portion comprises a pair of first blocks extending outwardly from opposite sides of the base element.

6. The electrical connector as claimed in claim 2, wherein said contacting portion comprises a first rid extending forwardly and a pair of first recesses respectively defined between lateral faces of the first rid and the block, said insulative insert comprises corresponding a pair of second blocks and a second recess defined between second blocks for engaging with the first recesses and the first rid.

7. The electrical connector as claimed in claim 6, wherein said first rid includes a pair of first post respectively extending into the first recess for interfering with an inner surface of the second block.

8. The electrical connector as claimed in claim 6, wherein said insulative insert comprises a second post disposed on a top surface thereof for positioning the first rid to the second recess.

9. An electrical connector comprising:

an insulative housing defining a pair of plug receiving cavities; a terminal sub-assembly including upper and lower terminal modules stacked with each other, each of said terminal modules being equipped with a plurality of terminals;

a base element, the terminal sub-assembly mounted to the base element, and a connection member located on a bottom thereof;

the terminal sub-assembly comprising an insulative insert and two rows of terminals mounted to the insulative insert;

a cutout formed in a front edge region of the base element and a pair of lateral projections formed on opposite upper and lower sides of said cutout so that engagement between the base element and the terminal sub-assembly constitutes a lying T-shaped configuration; said cutout is configured to cooperate with the terminal module with an inner edge engaging to a corresponding passage defined on a rear face of the insulative insert;

a top row of the terminals respectively has a contacting end received in said cutout of said base element and a tail portion extending outwardly from a side portion of said insulative insert and a lower row of terminals extend throughout an opposite first holes of a daughter board;

said daughter board attached to a side face of the base element.

10. The electrical connector as claimed in claim 9, wherein said base member and said terminal sub-assembly are interconnected as a cross in an elevational view.

11. The electrical connector as claimed in claim 9, wherein solder sections horizontally extending transversely around rear end of said horizontal sections to be directly soldered to the corresponding printed circuit board which are located on the lateral side of the base element, wherein the solder sections of said terminals are arranged in a horizontal array along said front-to-back direction.

* * * * *